United States Patent [19]
Goetting et al.

[11] Patent Number: 6,049,227
[45] Date of Patent: Apr. 11, 2000

[54] FPGA WITH A PLURALITY OF I/O VOLTAGE LEVELS

[75] Inventors: F. Erich Goetting; Scott O. Frake, both of Cupertino; Venu M. Kondapalli; Steven P. Young, both of San Jose, all of Calif.

[73] Assignee: Xilinx, Inc., San Jose, Calif.

[21] Appl. No.: 09/187,666

[22] Filed: Nov. 5, 1998

Related U.S. Application Data

[62] Division of application No. 08/837,023, Apr. 11, 1997.
[51] Int. Cl.$^7$ .................... H03K 19/0175; H03K 19/082
[52] U.S. Cl. ................................. 326/80; 326/49
[58] Field of Search ................. 326/80, 81, 49, 326/50

[56] References Cited

U.S. PATENT DOCUMENTS

| | | | |
|---|---|---|---|
| Re. 34,808 | 12/1994 | Hsiesh | 326/71 |
| 4,853,560 | 8/1989 | Iwamura et al. | 307/296.1 |
| 4,929,852 | 5/1990 | Bae | 326/71 |
| 5,298,807 | 3/1994 | Salmon et al. | 326/68 |

(List continued on next page.)

FOREIGN PATENT DOCUMENTS

| | | |
|---|---|---|
| 0482658A2 | 4/1992 | European Pat. Off. . |
| 0575124A2 | 12/1993 | European Pat. Off. . |
| 61053827 | 3/1986 | Japan . |
| 02146815 | 6/1990 | Japan . |
| 03117020 | 5/1991 | Japan . |
| 04158627 | 6/1992 | Japan . |
| 07142983 | 6/1995 | Japan . |

OTHER PUBLICATIONS

Altera Corporation Data Sheet "FLEX 10K Embedded Programmable Logic Family", Jun., 1996, Version 2, pp. 31, 54–59, available from Altera Corporation,2610 Orchard Parkway, San Jose, CA 95134–2020.

Intel Corporation Data Sheet "Pentium Pro Processor at 150 MHz, 166MHz, 180 MHz and 200 MHz", Nov. 1995, pp. 46–50, available from Intel Corporation, 2200 Mission College Blvd., Santa Clara CA 95052–8119.

Weste, N. and Eshraghian, K. "Principles of CMOS VLSI Design—A Systems Perspective", Second Edition, Addison–Wesley, 1993, pp. 84–86.

Altera Corporation, "A 3.3–V Programmable Logic Device that Addresses Low Power Supply and Interface Trends" by Rakesh Patel et al., Custom Integrated Circuits Conference (CICC), Santa Clara, California, May 5–8, 1997.

Vij, Sandeep, "Stepping down the FPGA voltage staircase," Computer Design Supplement, Feb. 1997, pp. 15–16.

Wilson, Ron, "Xilinx Speeds Submicron—Process Ramp", EE Times, Feb. 3, 1997.

Altera Press Release dated Monday, Apr. 7, 1997 entitled "Altera Supports Mixed–Voltage Systems with New Multivolt Interface".

The Programmable Logic Data Book, available from Xilinx, Inc., 2100 Logic Drive, San Jose, Ca 95124, 1996, pp. 4–292 through 4–293.

*Primary Examiner*—Michael Tokar
*Assistant Examiner*—Richard Roseen
*Attorney, Agent, or Firm*—Lois D. Cartier

[57] ABSTRACT

The invention comprises an FPGA having a plurality of input reference voltages and/or output voltage supplies. In one embodiment, two or more differential amplifiers in the same configurable input buffer use different input reference voltages. According to a second aspect of the invention, the I/O pad line is configurably connected to the input reference voltage line, so that any configurable Input/Output Block (IOB) can be used to supply the input reference voltage. According to a third aspect of the invention, the reference input of an I/O is configurably connected to any of two or more input reference voltage lines. According to another aspect of the invention, a single input reference voltage and/or a single output voltage supply is applied to each IOB, with the IOBs grouped into sets. Each set of IOBs has a separate input reference voltage and/or a separate output voltage supply.

15 Claims, 9 Drawing Sheets

U.S. PATENT DOCUMENTS

| | | | |
|---|---|---|---|
| 5,300,835 | 4/1994 | Assar et al. | 307/475 |
| 5,352,942 | 10/1994 | Tanaka et al. | 326/68 |
| 5,394,034 | 2/1995 | Becker et al. | 326/39 |
| 5,444,392 | 8/1995 | Sommer et al. | 326/31 |
| 5,448,198 | 9/1995 | Toyoshima et al. | 327/530 |
| 5,521,530 | 5/1996 | Yao et al. | 326/80 |
| 5,606,275 | 2/1997 | Farhang et al. | 327/108 |
| 5,774,100 | 6/1998 | Aoki et al. | 345/87 |
| 5,777,488 | 7/1998 | Dryer et al. | 326/37 |
| 5,793,222 | 8/1998 | Nakase | 326/86 |
| 5,801,548 | 9/1998 | Lee et al. | 326/86 |
| 5,862,390 | 1/1999 | Ranjan | 395/750.01 |
| 5,880,602 | 3/1999 | Kaminaga et al. | 326/81 |

| OUT | EN | UPB | DN |
|-----|----|----|----|
| 0 | 0 | 1 | 0 |
| 0 | 1 | 1 | 1 |
| 1 | 0 | 1 | 0 |
| 1 | 1 | 0 | 0 |

FPGA WITH A PLURALITY OF I/O VOLTAGE LEVELS

CROSS-REFERENCE TO RELATED APPLICATIONS

This application is a divisional of U.S. patent application Ser. No. 08/837,023, filed Apr. 11, 1997 [docket X-344 US] invented by F. Erich Goetting, Scott O. Frake, Venu M. Kondapalli, and Steven P. Young entitled "FPGA WITH A PLURALITY OF I/O VOLTAGE LEVELS" filed Apr. 11, 1997 which is incorporated herein by reference.

This application is related to commonly assigned, co-pending U.S. patent application Ser. No. 08/837,022 [docket X-333 US] invented by F. Erich Goetting, Scott O. Frake, and Venu M. Kondapalli entitled "INPUT/OUTPUT BUFFER SUPPORTING MULTIPLE I/O STANDARDS", which is incorporated herein by reference.

BACKGROUND OF THE INVENTION

1. Field of the Invention

The invention relates to Field Programmable Gate Arrays (FPGAs). More particularly, the invention relates to input/output (I/O) voltage levels in an FPGA.

2. Description of the Background Art

Existing I/O structures for integrated circuits (ICs) are typically designed to function according to a specific I/O standard. There are several different I/O standards in use, and new standards are often introduced. These I/O standards typically include such factors as output drive strength, receiver type, output driver type, and output signal slew rate. One such I/O standard is the GTL+ standard, described in pages 46 through 50 of the Pentium Pro Processor data sheet entitled "PENTIUM PRO PROCESSOR AT 150 MHz, 166 MHz, 180 MHz and 200 Mhz", published November 1995 and available from Intel Corporation, 2200 Mission College Blvd., Santa Clara, Calif. 95052-8119, which are incorporated herein by reference. ("Pentium" is a registered trademark owned by Intel Corporation.)

A typical Input/Output Block (IOB) in an FPGA supports only one I/O standard. However, FPGAs are often used to implement "glue logic" (logic used to interface between two or more standard circuits) and therefore often interface with multiple ICs. It would be desirable for an FPGA to be able to interface with ICs that follow two or more different I/O standards.

Additionally, existing I/O structures are typically designed to function at a specific supply voltage. For example, for many years, the majority of commercially available ICs were designed to function at a supply voltage of 5 Volts. However, as the typical gate length decreases throughout the IC industry, the typical supply voltage used in FPGAs and other ICs is decreasing. Many ICs are now available that function at 3.3 Volts, and voltages of 2.5 Volts and below are commonly discussed. Therefore, it would be desirable for an FPGA to be able to interface with different ICs that function at two or more different supply voltages.

It is known in FPGA design to use one voltage for driving outputs and a different voltage in the interior (core) of the FPGA. One FPGA having a separate output voltage supply is the FLEX 10K™ FPGA from Altera Corporation, as disclosed on pages 54 to 59 of the "FLEX 10K Embedded Programmable Logic Family Data Sheet" from the Altera Digital Library 1996, available from Altera Corporation, 2610 Orchard Parkway, San Jose, Calif. 95134-2020, which are incorporated herein by reference. ("FLEX 10K" is a trademark of Altera Corporation.) In the FLEX 10K device, output voltage supply pins are provided that can be connected as a group to only one output supply voltage, either a 3.3-Volt or a 5-Volt power supply. Known FPGAs therefore typically provide for a single output supply voltage, which applies to all configurable I/O buffers on the FPGA.

Output slew rate is also programmable in known FPGAs including the XC3000 family of devices from Xilinx, Inc., as described on pages 4-292 through 4-293 of the Xilinx 1996 Data Book entitled "The Programmable Logic Data Book", available from Xilinx, Inc., 2100 Logic Drive, San Jose, Calif. 95124, which are incorporated herein by reference. (Xilinx, Inc., owner of the copyright, has no objection to copying these and other pages referenced herein but otherwise reserves all copyright rights whatsoever.) However, in such FPGAs, factors such as output drive strength, receiver type, and output driver type are not known to be configurable to meet a particular I/O standard.

Some I/O standards require that an input reference voltage be supplied. An input voltage above the input reference voltage is interpreted as a "high" voltage level; an input voltage below the input reference voltage is interpreted as a "low" voltage level. Therefore, the input reference voltage establishes a "trip point" for interpreting input signals. As far as is known, no FPGA allows a user to supply an input reference voltage.

SUMMARY OF THE INVENTION

To fully understand the invention, it is first necessary to define the several voltage levels involved in input/output buffers according to the several aspects of the invention. The "core voltage", VCCC, is the supply voltage used for the interior (non-I/O) part of the FPGA. (In one embodiment, VCCC is also used as the supply voltage for the pulldown logic in the pre-driver and output buffer.) The "input supply voltage", VCCI, is the supply voltage used for the input buffer. The "output supply voltage", VCCO, is the supply voltage used for the pullup logic in the output buffer. The terms VCCC, VCCI, and VCCO are also used to designate the power supplies supplying the corresponding voltages. Two or more of these voltages may be connected to each other; in one embodiment VCCC and VCCI are connected together and VCCO is separate. The input reference voltage required by some I/O standards is referenced herein as VREF.

A first aspect of the invention comprises a configurable input/output buffer for an FPGA that can be configured to comply with any of two or more different I/O standards. In one embodiment of the invention, input signals can be supplied to the FPGA at a voltage level with a specified switching point, where the specified switching point (the input reference voltage) is externally supplied to the FPGA. Other factors that vary from one I/O standard to another are also configurable.

One input/output buffer according to the invention comprises two configurable buffers, an input buffer and an output buffer. The two buffers may be separately or collectively configurable. In some embodiments, only the input buffer, or only the output buffer, is configurable.

In one embodiment, the input buffer can be configured to select a particular I/O standard. The input standard is selected by configuring an input multiplexer that selects between three input paths from the pad to an input signal line: 1) a Schmitt trigger such as is commonly used in FPGAs; 2) a differential amplifier for low input reference voltages (voltages below about 0.7 Volts); and 3) a differential amplifier for high input reference voltages (voltages above about 0.7 Volts). A standard input buffer can be used instead of a Schmitt trigger. The input reference voltage for the differential amplifier is dependent on the I/O standard and is supplied by the user. In one embodiment, two or more differential amplifiers in the same configurable input buffer use different input reference voltages.

In one embodiment, the output buffer can be configured to select a particular I/O standard. The I/O standard is selected by providing a series of pullups (pullup devices) and pulldowns (pulldown devices) on the output pad line (a signal line connected to the I/O pad), and by connecting the appropriate supply voltage to the output supply voltage (VCCO) pads. One or more pullups and pulldowns are enabled or disabled by configuration logic, such that the resulting total pullup and pulldown transistor widths correspond to the values needed to implement a particular I/O standard. According to the invention, for any particular standard the maximum voltage on a voltage-high output signal is set by the user by connecting the output voltage power supply to the desired voltage level.

According to a second aspect of the invention, the I/O pad line is configurably connected to the input reference voltage line driving the input reference voltage input port (hereinafter referred to as the "reference input") in the IOB. Therefore, an I/O pad can be used to supply the input reference voltage.

According to a third aspect of the invention, the reference input of an IOB is configurably connected in the IOB to any of two or more available input reference voltages. Alternatively, the output voltage supply of an IOB is configurably connected in the IOB to any of two or more available output supply voltages.

According to a fourth aspect of the invention, a single input reference voltage is applied to each IOB, with the IOBs grouped into sets. Each set of IOBs has a separate input reference voltage. In one embodiment, each input reference voltage is applied to the IOBs on one half-edge of the FPGA die. Therefore, on a rectangular die, eight separate input reference voltages are applied. These input reference voltages can be connected together outside the FPGA package, or within the FPGA package by leads or other means, or configurably connected within the FPGA.

According to a fifth aspect of the invention, the IOBs are grouped into sets and each set of IOBs has a separate output voltage supply. In one embodiment, each output voltage supply is applied to the IOBs on one half-edge of the FPGA die. Therefore, on a rectangular die, eight separate output voltage supplies are applied to eight sets of IOBs. In one embodiment, input reference voltages and output voltage supplies are each applied to one half-edge of an FPGA die. Therefore, in this embodiment eight separate input reference voltages and eight separate output voltage supplies are applied to eight sets of IOBs.

BRIEF DESCRIPTION OF THE DRAWINGS

The present invention is illustrated by way of example, and not by way of limitation, in the following figures.

DETAILED DESCRIPTION OF THE DRAWINGS

Several embodiments of the invention are described. In the following description, numerous specific details are set forth in order to provide a more thorough understanding of the present invention. However, it will be apparent to one skilled in the art that the present invention may be practiced without these specific details. In other instances, well-known features have not been described in detail in order not to unnecessarily obscure the present invention.

First Aspect of the Invention

Figure 1:
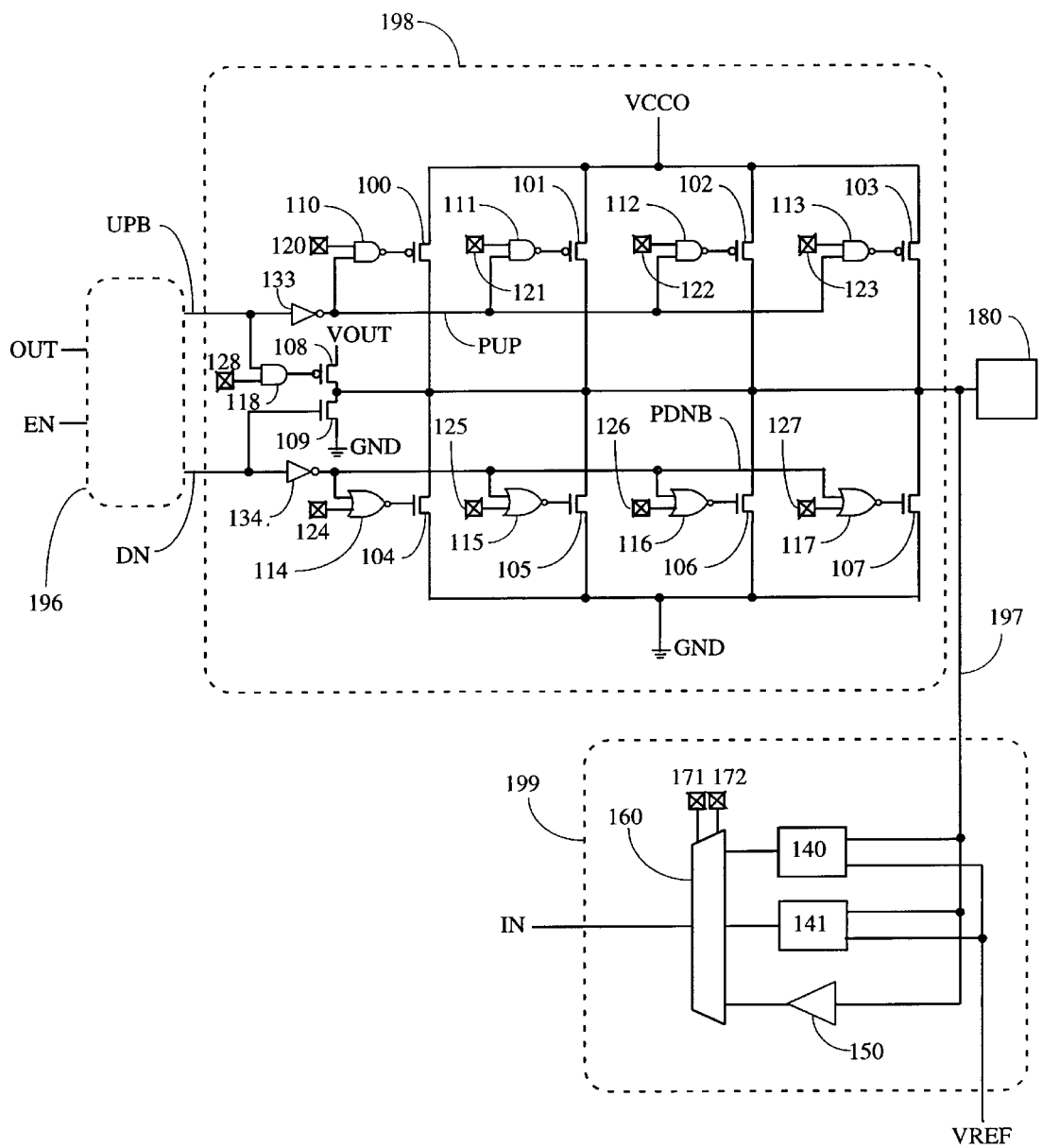
FIG. 1 shows a schematic representation of an input/ output buffer according to a first aspect of the invention.

FIG. 1 shows an input/output buffer according to a first aspect of the invention. The input/output buffer of FIG. 1 comprises: 1) pre-driver 196, driven by output signal line OUT and enable signal EN and driving signal lines UPB and DN; 2) output buffer 198, driven by signal lines UPB and DN and driving pad line 197; 3) pad 180 coupled to pad line 197; and 4) input buffer 199, driven by pad line 197 and driving input signal line IN.

In output buffer 198, signal line UPB drives 2-input AND-gate 118, which drives PMOS pullup 108 connected to pad line 197. (AND-gate 118 may be implemented as a NAND-gate followed by an inverter.) The second input to AND-gate 118 is a configuration bit in configuration memory cell 128. (Configuration memory cells are represented in the figures herein by a box containing an "x".) Memory cell 128 can therefore be used to disable pullup 108 when an open-drain output is required. Signal line UPB further drives inverter 133 which generates active-high pullup signal PUP. Signal line DN directly drives NMOS pulldown 109 connected to pad line 197, and further drives inverter 134 which generates active-low pulldown signal PDNB. In one embodiment, inverters 133, 134 are designed to function as delay elements, ensuring that pullup 108 and pulldown 109 become active before any other pullups or pulldowns in output buffer 198, thereby reducing ground bounce.

Output buffer 198 further comprises four pullups 100, 101, 102, 103. In the embodiment of FIG. 1, pullups 100, 101, 102, 103, 108 are implemented as PMOS transistors, but NMOS transistors or resistors can be used. In this embodiment, each pullup 100, 101, 102, 103 is driven by a 2-input NAND-gate, 110, 111, 112, 113, respectively. Each NAND-gate 110, 111, 112, 113 is enabled or disabled by a configuration bit in one of configuration memory cells 120, 121, 122, 123, respectively. In this embodiment, when a configuration bit in one of configuration memory cells 120, 121, 122, 123, 128 is at a high voltage level, the corresponding pullup is enabled, and pad line 197 is pulled high whenever pullup signal PUP goes high.

Using the configuration bits in configuration memory cells 120, 121, 122, and 123, one, two, three, or four pullups are configurably enabled. (However, a configurably enabled pullup does not become active until pullup signal PUP goes high.) When a different I/O standard is needed, the number of enabled pullups can be changed. A ratio of 1:2:4:8 in pullup widths is found to give a wide range of output drive capabilities, allowing the formation of total configurable pullup widths of 1, 2, 3, 4, 5, 6, 7, 8, 9, 10, 11, 12, 13, 14, and 15 times the width of the narrowest pullup. This total configurable pullup width (made up of those of pullups 100, 101, 102, 103 which are configurably enabled) is then added to the width of pullup 108 to make the total pullup width. Different types of configuration logic for enabling and disabling the pullups can be used, such as a separate configurable enabling gate in series with each pullup. Different numbers of pullups or pullups of different widths can be provided. The slew rate of a rising-edge output signal can be controlled by controlling the rate at which each pullup turns on, for example by giving each controlling NAND-gate or other circuit a different rise or fall time, or by inserting delay elements into pullup signal PUP so that the different pullups become active at different times. These and other modifications fall within the scope of the invention.

Output buffer 198 further comprises four pulldowns 104, 105, 106, 107 (in addition to pulldown 109) that can pull pad line 197 to ground voltage level GND. Pulldowns 104, 105, 106, 107 are controlled in this embodiment by 2-input NOR-gates 114, 115, 116, 117, respectively. Each NOR-gate 114, 115, 116, 117 is enabled or disabled by a configuration bit in one of configuration memory cells 124, 125, 126, 127, respectively. In this embodiment, when a configuration bit in one of configuration memory cells 124, 125, 126, 127 is at a low voltage level, the corresponding pulldown is enabled. As with the configurable pullups, many modifications can be applied to the configurable pulldowns and these modifications fall within the scope of the invention.

In this embodiment, all logic on the pullup side of output buffer 198 (comprising pullups 100, 101, 102, 103, 108, NAND-gates 110, 111, 112, 113, AND-gate 118, and inverter 133) uses output voltage supply VCCO as the positive voltage supply. All logic on the pulldown side of output buffer 198 (comprising NOR-gates 114, 115, 116, 117 and inverter 134) uses the core supply voltage VCCC (connections to VCCC not shown in FIG. 1) as the positive voltage supply.

In one embodiment, device sizes in output buffer 198 are as follows. A single number indicates a device width in microns, and two numbers formatted as "p/n" indicate gate widths in microns of P-channel and N-channel devices, respectively, in a logic gate. All gate lengths are 0.25 microns except as otherwise noted, in which case they are given in microns. The term "N-channel" denotes an N-channel transistor. The term "P-channel" denotes a P-channel transistor.

Pullup 100: 40
Pulldown 104: 40
Pullup 108: 40
Pullup 101: 80
Pulldown 105: 80
Pulldown 109: 40
Pullup 102: 160
Pulldown 106: 160
Inverter 133: 8/4 (gate length 0.5)
Pullup 103: 320
Pulldown 107: 320
Inverter 134: 8/4 (gate length 0.5)
NAND-gate 110: 4/4
NOR-gate 114: 4/4
NAND-gate 111: 8/8
NOR-gate 115: 8/8
NAND-gate 112: 16/16
NOR-gate 116: 16/16
NAND-gate 113: 32/32
NOR-gate 117: 32/32

FIG. 1 also shows a simplified schematic drawing of configurable input buffer 199. Input buffer 199 comprises input multiplexer 160, which is configured by configuration bits in configuration memory cells 171, 172 to select the input path compatible with the desired I/O standard. Multiplexer 160 passes the signal from the selected input path to input signal line IN. Input multiplexer 160 has three inputs. One input to multiplexer 160 is supplied by Schmitt trigger 150. (Schmitt triggers are well known to persons of ordinary skill in the art of input buffer design.) When enabled, Schmitt trigger 150 passes on the signal on pad line 197. A second input to input multiplexer 160 is supplied by differential amplifier 140, which in one embodiment is an NMOS differential amplifier that compares the voltage level on pad line 197 to the input reference voltage on reference input VREF. If the voltage level on pad line 197 is higher than the input reference voltage on reference input VREF, the output of NMOS differential amplifier 140 is high; otherwise it is low. NMOS differential amplifier 140 only functions correctly when the input reference voltage on reference input VREF is above about 0.7 Volts. Therefore, in one embodiment NMOS differential amplifier 140 is only configured as active when following I/O standards that specify an input reference voltage above about 0.7 Volts. A third input to input multiplexer 160 is supplied by differential amplifier 141, which in one embodiment is a PMOS differential amplifier. In one embodiment, PMOS differential amplifier 141 is only configured as active when following I/O standards that specify an input reference voltage below about 0.7 Volts. In one embodiment, the configuration logic disables the unused Schmitt trigger and/or differential amplifier(s), to reduce power consumption. However, this capability is not an essential part of the input/output buffer of the invention. The input reference voltage on reference input VREF is dependent on the I/O standard and is supplied by the user.

In this embodiment, input buffer 199 uses input supply voltage VCCI (not shown in FIG. 1) as the positive voltage supply.

In one embodiment of the invention, each input/output buffer is separately configurable. However, two or more input/output buffers can be grouped such that they are controlled by the same configuration bits. In another embodiment of the invention, only a configurable input buffer may be provided. In yet another embodiment of the invention, only a configurable output buffer may be provided.

Figures 2, 2A:
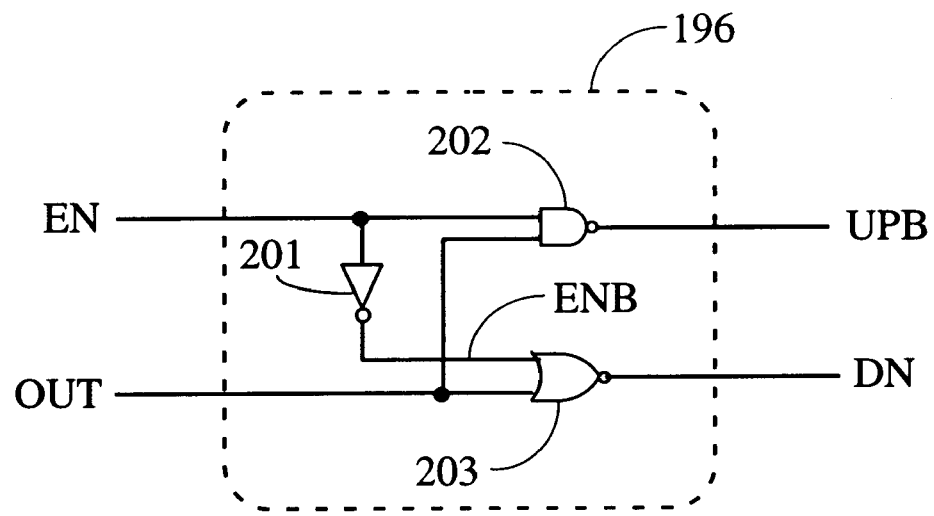
FIG. 2 shows a schematic representation of a prior art pre-driver that can be used in the embodiment of FIG. 1.
FIG. 2A shows a state table for the prior art pre-driver of FIG. 2.

FIG. 2 shows prior art pre-driver 196 well-known in the art of output buffer design. Active-high enable signal EN is inverted by inverter 201 to generate active-low enable signal ENB. Active-high enable signal EN and output signal line OUT drive 2-input NAND-gate 202, which generates signal line UPB. Active-low enable signal ENB and output signal line OUT drive 2-input NOR-gate 203, which generates signal line DN. A state-table for input signals OUT, EN and output signals UPB, DN is shown in FIG. 2A. From FIG. 2A, it is seen that pullups 100, 101, 102, 103, 108 will only be activated (i.e., signal line UPB will only be low) when both output signal line OUT and enable signal EN are high. Configurable pulldowns 104, 105, 106, 107 will only be activated (i.e., signal line DN will only be high) when output signal line OUT is low and enable signal EN is high.

In this embodiment, all logic on the pullup side of pre-driver 196 (comprising NAND-gate 202) uses output voltage supply VCCO (not shown in FIG. 2) as the positive voltage supply. All logic on the pulldown side of pre-driver 196 (comprising NOR-gate 203 and inverter 201) uses the core supply voltage VCCC (not shown in FIG. 2) as the positive voltage supply.

Figure 3:
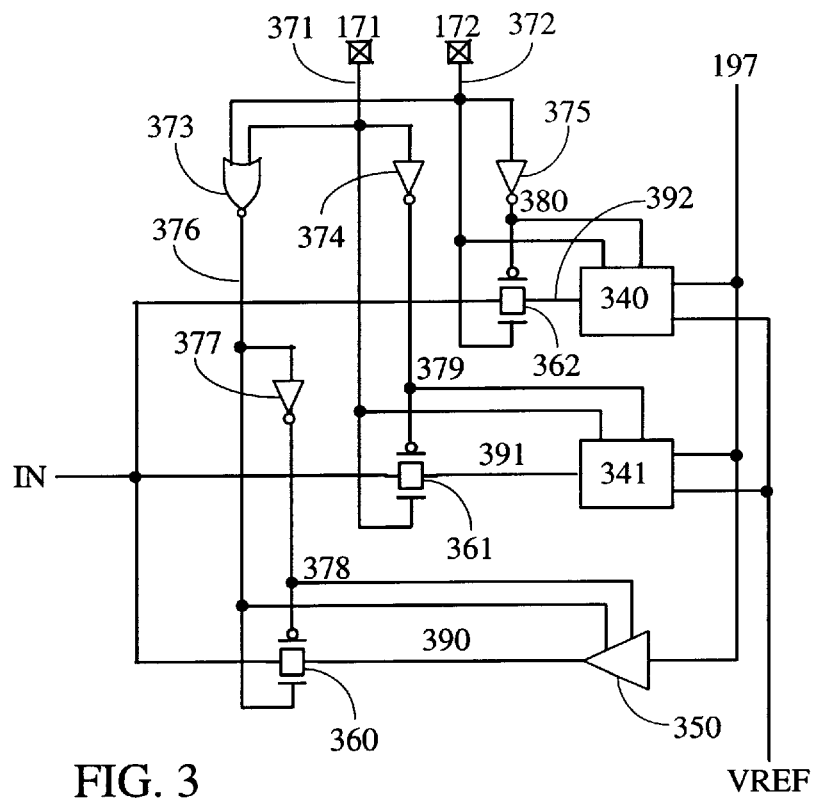
FIG. 3 shows a detailed schematic representation of the input buffer portion of FIG. 1.

FIG. 3 shows a more detailed schematic of input buffer 199 of FIG. 1. In this embodiment, multiplexer 160 of FIG. 1 is implemented as three transmission gates 360, 361 and 362, each comprising one N-channel transistor and one P-channel transistor. Transmission gate 362, which configurably passes the output of NMOS differential amplifier 340 to input signal line IN, is enabled by a configuration bit in configuration memory cell 172 and its complement signal on line 380 generated by inverter 375. Transmission gate 361, which configurably passes the output of PMOS differential amplifier 341 to input signal line IN, is enabled by a configuration bit in configuration memory cell 171 and its complement signal on signal line 379 generated by inverter 374. Transmission gate 360, which configurably passes the output of Schmitt trigger 350 to input signal line IN, is enabled by the output (signal line 376) of NOR-gate 373 and its complement signal on signal line 378 generated by inverter 377. NOR-gate 373 is driven by the configuration bits in configuration memory cells 171, 172.

In one embodiment, device sizes in the input buffer of FIG. 3 are as follows:
Inverter 374: 1/1
Inverter 375: 1/1
Inverter 377: 1/1
Transmission Gate 360: 3/3
Transmission Gate 361: 3/3
Transmission Gate 362: 3/3
NOR-gate 373: 1/1

Figure 4:
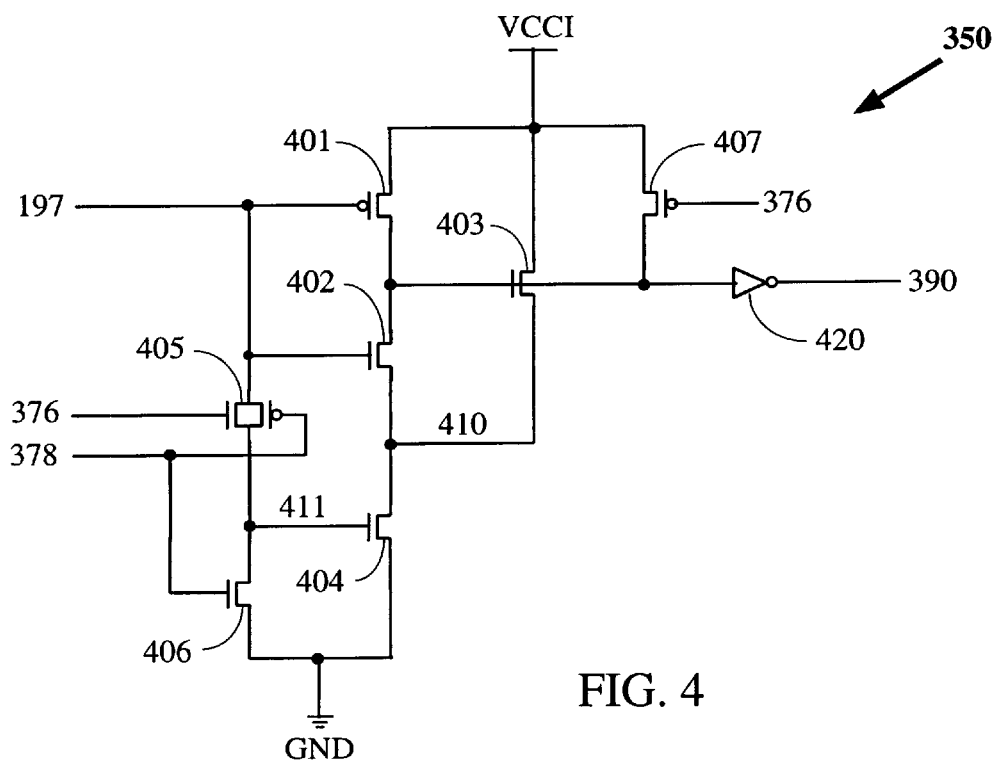
FIG. 4 shows a schematic representation of a Schmitt trigger in the input buffer of FIG. 3.

FIG. 4 shows a schematic representation of Schmitt trigger 350 in the input buffer of FIG. 3. The operation of Schmitt trigger 350 is not explained herein, as Schmitt trigger input buffers are notoriously well-known in the art. One such Schmitt trigger is described in Reissue U.S. Pat. No. Re. 34,808, "TTL/CMOS Compatible Input Buffer with Schmitt Trigger", which is incorporated herein by reference and title to which is held by the assignee hereof.

However, one feature distinguishes Schmitt trigger 350 from typical Schmitt triggers, and that is the ability to be enabled and disabled. Schmitt trigger 350 is controlled by enable signal lines 376 and 378 driving N-channel and P-channel transistors, respectively, of transmission gate 405, by enable signal line 378 driving N-channel transistor 406, and by enable signal line 376 driving P-channel transistor 407. When the signal on line 376 is high, and the complementary signal on line 378 is low, Schmitt trigger 350 functions as a typical Schmitt trigger. When the signal on line 376 is low, and the complementary signal on line 378 is high, Schmitt trigger 350 is disabled to save power. When disabled, Schmitt trigger 350 no longer draws current from input power supply VCCI regardless of the voltage on pad line 197.

In one embodiment, device sizes in the Schmitt trigger of FIG. 4 are as follows:
P-channel 401: 20
N-channel 402: 11
N-channel 403: 9
Transmission Gate 405: 2/2
N-channel 406: 2
N-channel 404: 11
Inverter 420: 12/6
P-channel 407: 2

Figure 5:
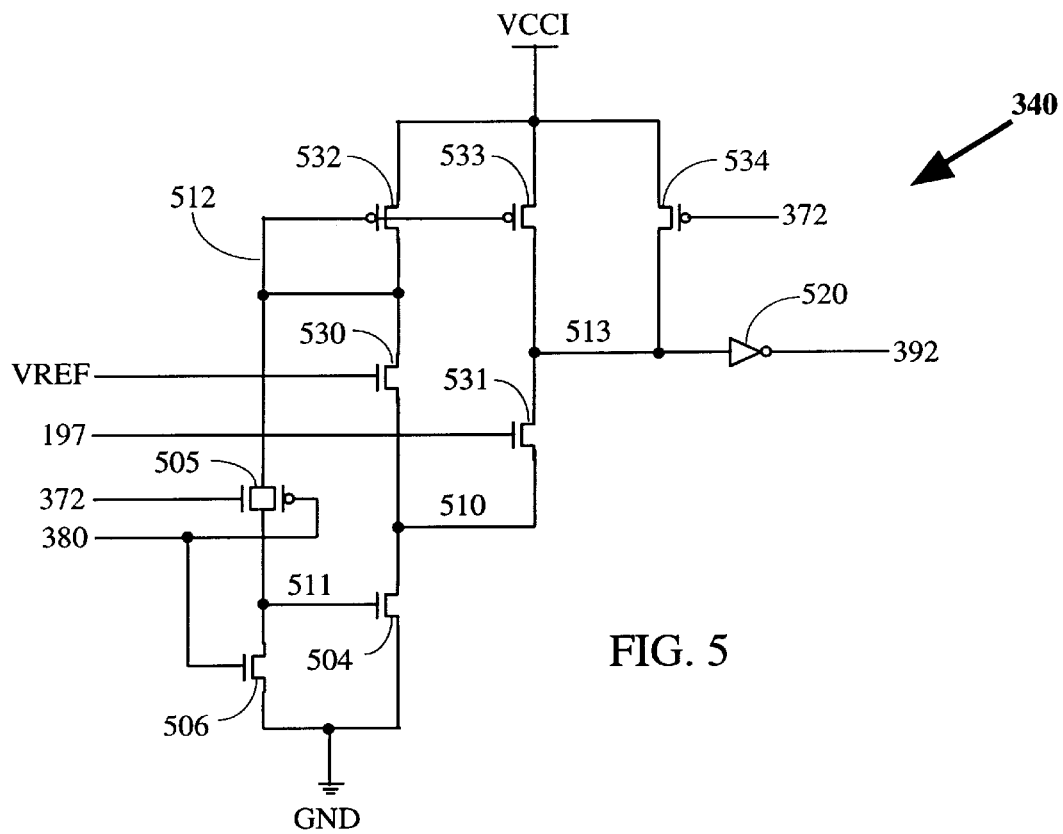
FIG. 5 shows a schematic representation of an NMOS differential amplifier in the input buffer of FIG. 3. (An NMOS differential amplifier is a differential amplifier wherein the input and VREF are connected to N-channel transistors.)

FIG. 5 shows a schematic representation of NMOS differential amplifier 340 in the input buffer of FIG. 3. The operation of NMOS differential amplifier 340 is not explained herein, as NMOS differential amplifiers are notoriously well-known in the art. One such NMOS differential amplifier is described in pages 84 through 86 of "Principles of CMOS VLSI Design: A Systems Perspective", Second Edition, by Neil H. E. Weste and Kamran Eshraghian, published in 1993 by the Addison-Wesley Publishing Company, which are incorporated herein by reference.

However, one feature distinguishes NMOS differential amplifier 340 from typical NMOS differential amplifiers, and that is the ability to be enabled and disabled. NMOS differential amplifier 340 is controlled by enable signal lines 372 and 380 driving N-channel and P-channel transistors, respectively, of transmission gate 505, and by enable signal line 380 driving N-channel transistor 506. When the signal on line 372 is high, and the complementary signal on line 380 is low, NMOS differential amplifier 340 functions as a typical NMOS differential amplifier. When the signal on line 372 is low, and the complementary signal on line 380 is high, NMOS differential amplifier 340 is disabled to save power. When disabled, NMOS differential amplifier 340 no longer draws current from input power supply VCCI regardless of the voltage on pad line 197.

In one embodiment, device sizes in the NMOS differential amplifier of FIG. 5 are as follows:
P-channel 532: 18
P-channel 533: 18
P-channel 534: 2
Transmission Gate 505: 2/2
N-channel 530: 55
N-channel 531: 55
Inverter 520: 18/6
N-channel 506: 2
N-channel 504: 12

Figure 6:
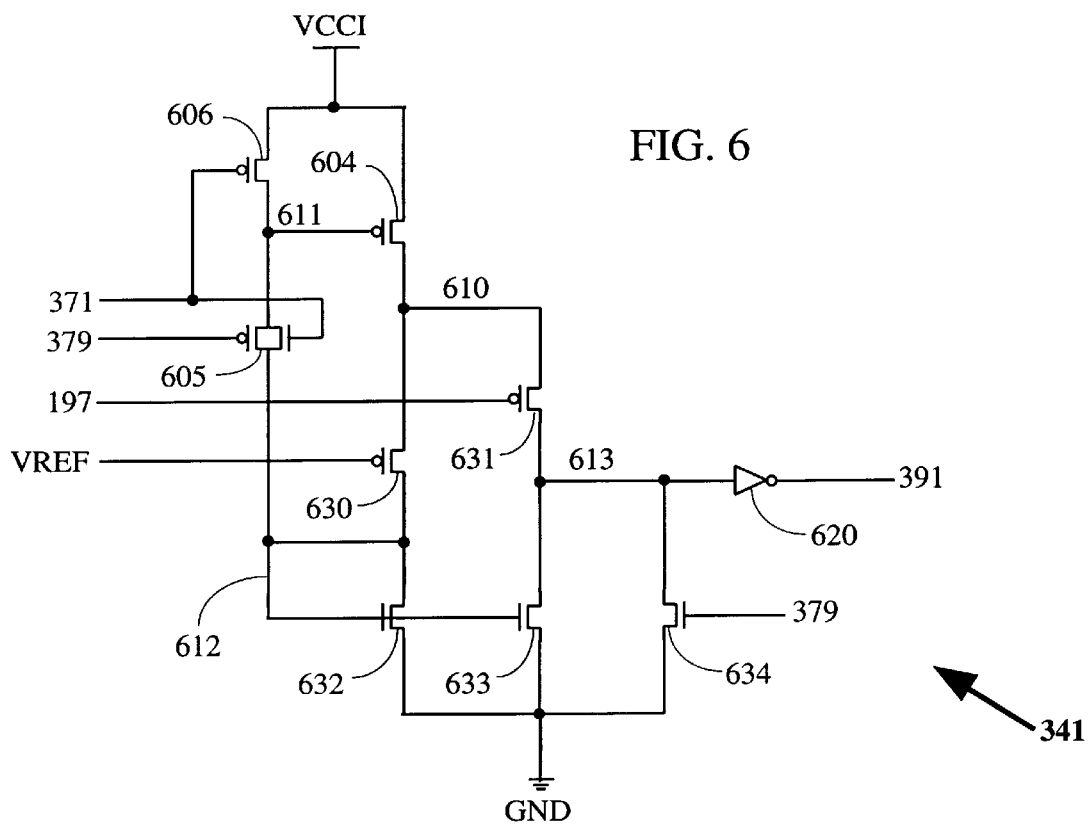
FIG. 6 shows a schematic representation of a PMOS differential amplifier in the input buffer of FIG. 3. (A PMOS differential amplifier is a differential amplifier wherein the input and VREF are connected to P-channel transistors.)

FIG. 6 shows a schematic representation of PMOS differential amplifier 341 in the input buffer of FIG. 3. The operation of PMOS differential amplifier 341 is not explained herein, as PMOS differential amplifiers are notoriously well-known in the art. PMOS differential amplifier 341 behaves the same way as NMOS differential amplifier 340. Comparing FIGS. 5 and 6, it is seen that the two circuits are mirror images except that ground voltage level GND and input supply voltage VCCI are reversed and N-channel and P-channel transistors are reversed. Transistor widths also differ in the two differential amplifiers, because of the differences between N-channel and P-channel devices.

One feature distinguishes PMOS differential amplifier 341 from typical PMOS differential amplifiers, and that is the ability to be enabled and disabled. PMOS differential amplifier 341 is controlled by enable signal lines 371 and 379 driving N-channel and P-channel transistors, respectively, of transmission gate 605, and by enable signal line 371 driving P-channel transistor 606. When the signal on line 371 is high, and the complementary signal on line 379 is low, PMOS differential amplifier 341 functions as a typical PMOS differential amplifier. When the signal on line 371 is low, and the complementary signal on line 379 is high, PMOS differential amplifier 341 is disabled to save power. When disabled, PMOS differential amplifier 341 no longer draws current from input power supply VCCI regardless of the voltage on pad line 197.

In one embodiment, device sizes in the PMOS differential amplifier of FIG. 6 are as follows:
N-channel 632: 22.5
N-channel 633: 22.5
N-channel 634: 2
Transmission Gate 605: 2/2
P-channel 630: 65
P-channel 631: 65
Inverter 620: 11.25/22.5
P-channel 606: 2
P-channel 604: 22.5

Second Embodiment of the Invention

Figure 7:
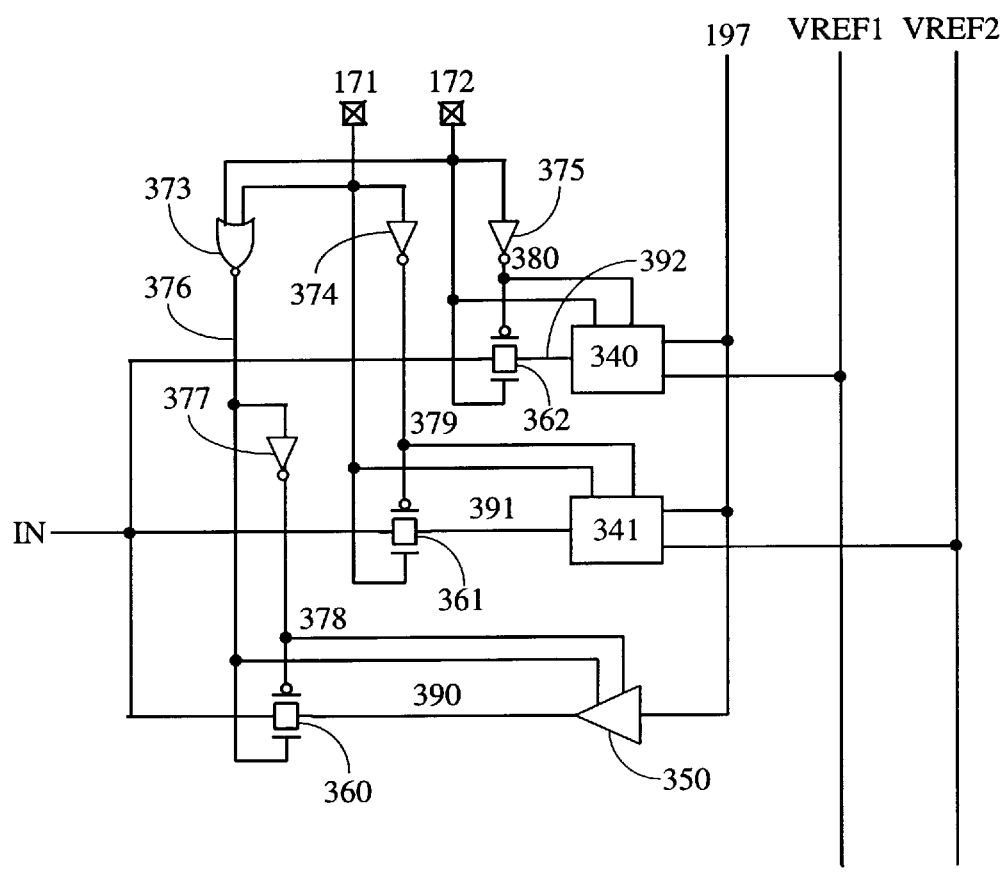
FIG. 7 shows a configurable input buffer according to another embodiment of the invention in which two differential amplifiers in the same configurable input buffer use different input reference voltages.

FIG. 7 shows a configurable input buffer according to a second embodiment of the invention. The input buffer of FIG. 7 resembles the input buffer of FIG. 3, except that two separate input reference voltages are supplied on input reference voltage lines VREF1 and VREF2. NMOS differential amplifier 340 compares the voltage level on pad line 197 to the input reference voltage on input reference line VREF1. PMOS differential amplifier 341 compares the voltage level on pad line 197 to the input reference voltage on input reference line VREF2.

Second Aspect of the Invention

Figure 8:
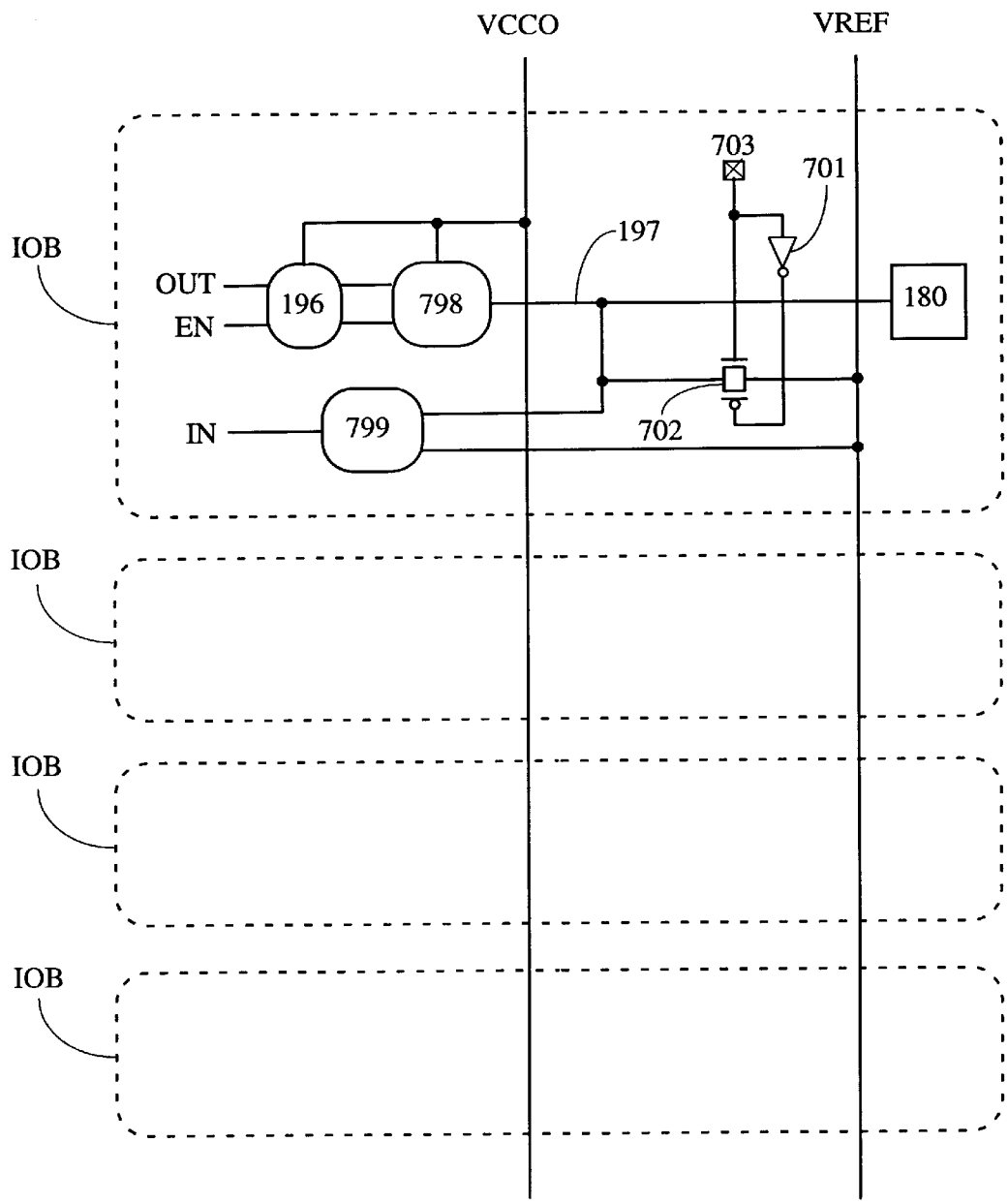
FIG. 8 shows an FPGA IOB in which the I/O pad is configurably connected to the input reference voltage line according to a second aspect of the invention.

FIG. 8 shows an IOB according to a second aspect of the invention. The IOB of FIG. 8 comprises pre-driver 196, output buffer 798, pad 180 and input buffer 799. In this embodiment, I/O pad 180 can either be used to supply input reference voltage VREF, or as a signal pad. Pad line 197, which is connected to pad 180, is configurably connected to an input reference voltage line (which in this embodiment is the same as reference input VREF) through transmission gate 702. Transmission gate 702 is enabled by a configuration bit in configuration memory cell 703 and its complement generated by inverter 701. The input reference voltage can go through transmission gate 702 to the input buffer in this fashion because transmission gate 702 does not cause a drop in voltage level on a signal passing therethrough. Input buffer 799 can be made configurable as with input buffer 199 of FIG. 1, but a non-configurable buffer can also be used. Output buffer 798 can be made comfigurable as with output buffer 198 of FIG. 1, but a non-configurable buffer can also be used.

This structure can be used to supply the input reference voltage from any configurable IOB.

Third Aspect of the Invention

Figure 9:
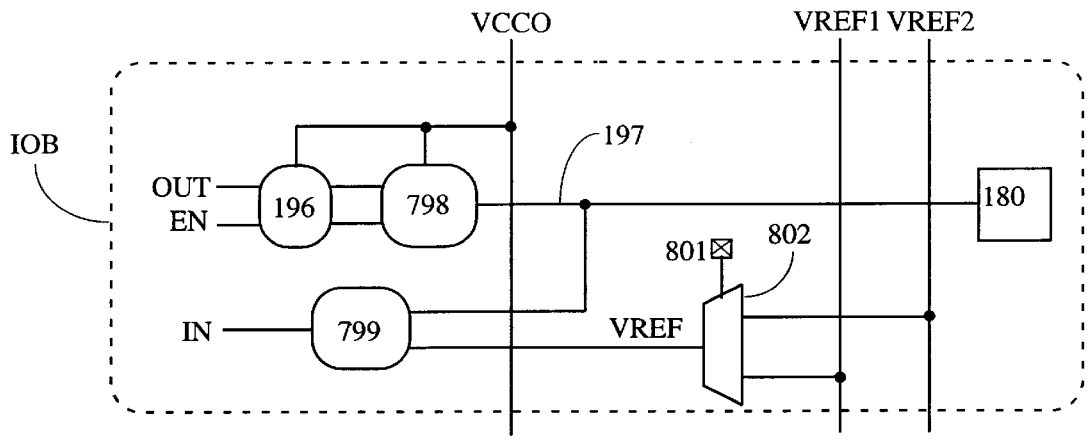
FIG. 9 shows an IOB in which the reference input is configurably connected to either of two available input reference voltage lines in accordance with a third aspect of the invention.

FIG. 9 shows an IOB in which the reference input VREF is configurably connected to either of two available input reference voltages, in accordance with a third aspect of the invention. In this embodiment, multiplexer 802 selects between two input reference lines VREF1 and VREF2. Multiplexer 802 is controlled by a configuration bit stored in memory cell 801. Multiplexer 802 supplies reference input VREF to input buffer 799. In other embodiments, more than two input reference voltages are available, and 2-input multiplexer 802 is replaced by a wider multiplexer controlled by more than one configuration bit. This and other modifications fall within the scope of the invention.

Figure 9A:
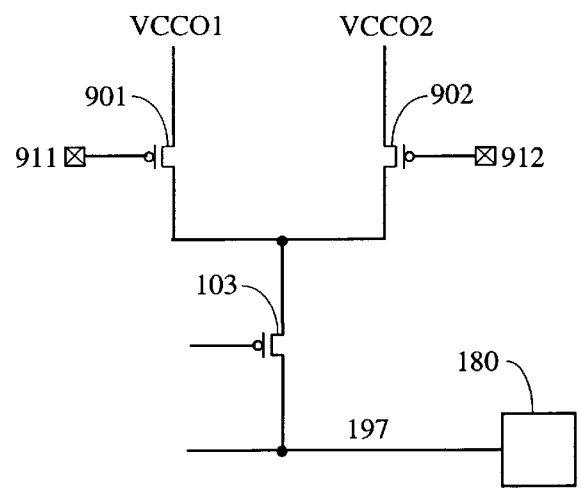
FIG. 9A shows a structure for configurably using either of two output voltage supplies in a single IOB.

Similarly, the output voltage supply of an IOB can be configurably connected in the IOB to any of two or more available output supply voltages (VCCOs). In one embodiment, shown in FIG. 9A, each pullup 103 on output pad line 197 is connected in series with two or more additional P-channel transistors 901, 902, 903, each of which is connected to a different output supply voltage (VCCO1, VCCO2 VCCO3), and each of which can be configurably enabled or disabled by a configuration bit in one of memory cells 911, 912 913. In one embodiment, two output supply voltages are available to each IOB in the FPGA, and each IOB can be independently configured to use either of the two output supply voltages.

Figure 10:
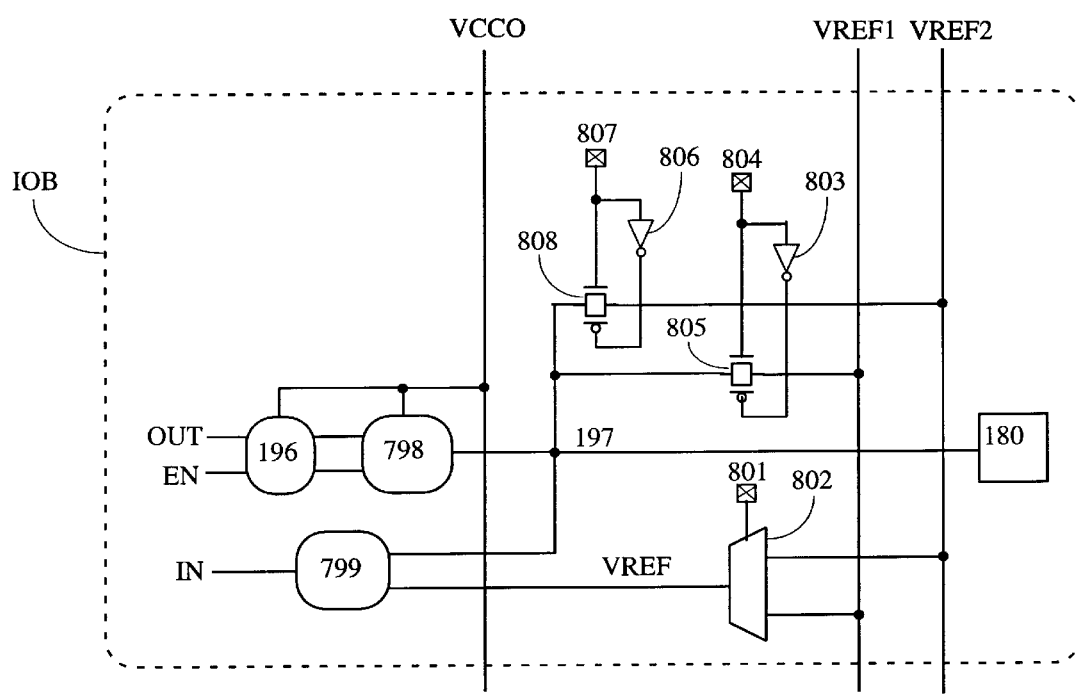
FIG. 10 shows an IOB in which the reference input is configurably connected to either of two available input reference voltages, and the I/O pad is configurably connected to either of two available input reference voltage lines.

FIG. 10 shows an embodiment of the invention that combines the novel aspects of FIGS. 8 and 9. In this embodiment, I/O pad 180 can be used either: 1) to supply one of two input reference voltages to input reference lines VREF1 and VREF2; or 2) as an input pad with input buffer 799 using either of input reference lines VREF1 and VREF2 to supply the reference input. I/O pad 180 is configurably connected to input reference lines VREF1 and VREF2 through transmission gates 805 and 808, respectively. Transmission gate 805 is enabled by a configuration bit in configuration memory cell 804 and its complement generated by inverter 803. Transmission gate 808 is enabled by a configuration bit in configuration memory cell 807 and its complement generated by inverter 806. Multiplexer 802, as described with reference to FIG. 9, programmably selects between VREF1 and VREF2 and generates reference input VREF. FIG. 10 shows only one of many combinations and variations that fall within the scope of the invention.

Fourth and Fifth Aspects of the Invention

Figure 11:
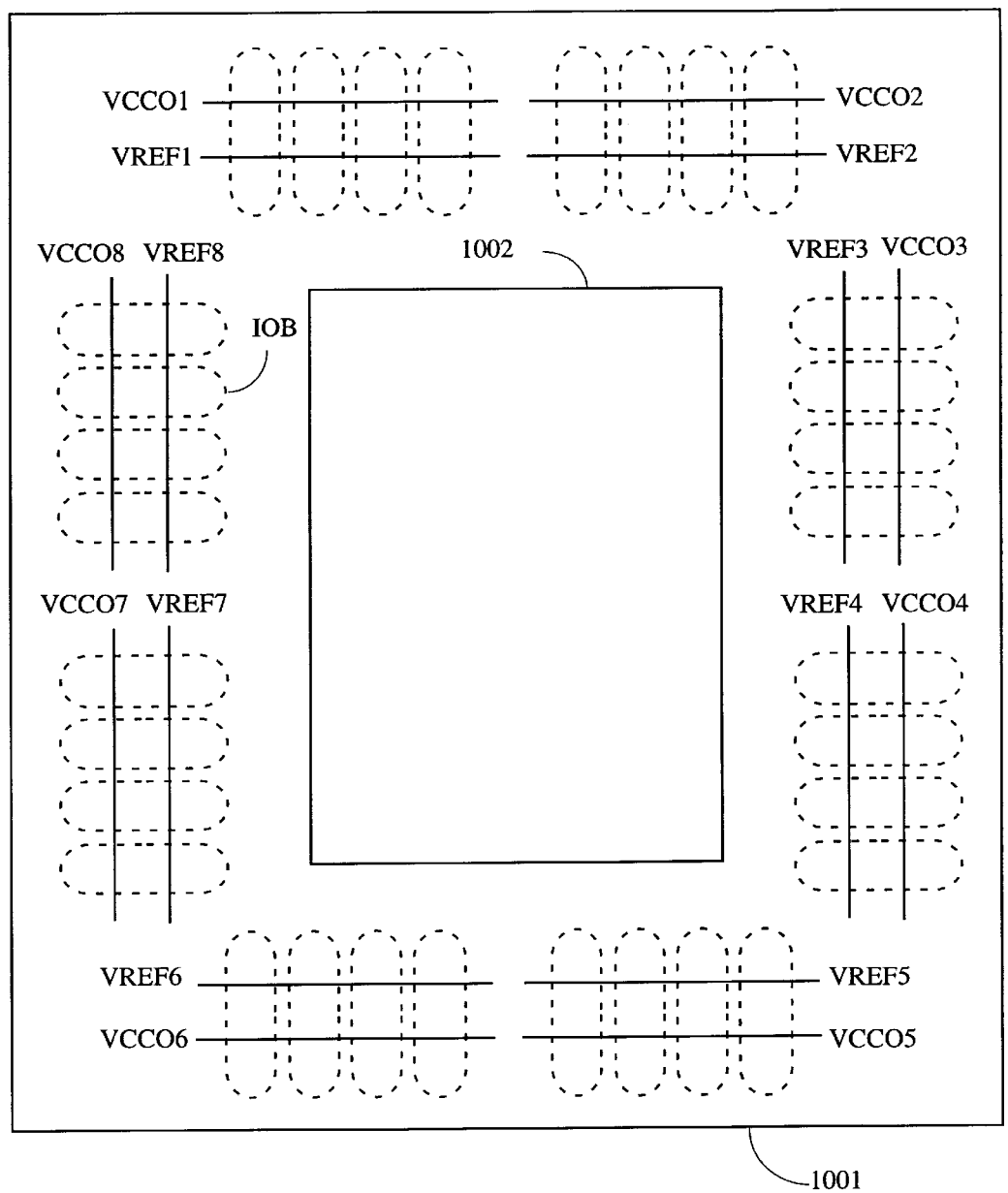
FIG. 11 shows a simplified drawing of an FPGA I/O pad ring with eight separate input reference voltages and eight separate output voltage supplies.

FIG. 11 shows a simplified drawing of an FPGA I/O pad ring showing a plurality of IOBs along all four edges. (An FPGA will typically have many more IOBs than are shown in FIG. 11, but only 32 IOBs are shown so as not to obscure the drawing.) The FPGA of FIG. 11 has eight sets of IOBs, with eight separate input reference voltages and eight separate output voltage supplies. Therefore, each set of IOBs has at least one associated input reference voltage pad, and at least one associated output supply voltage pad. The input reference voltage pads associated with different sets of IOBs are electrically isolated from each other, and the output supply voltage pads associated with different sets of IOBs are electrically isolated from each other. However, the different input reference voltage pads and/or the different output supply voltage pads may be connected together external to the FPGA. In one embodiment, there is a set of one or more output supply voltage pads associated with each set of IOBs. Each set of IOBs is connectable to a different one of such sets of output supply voltage pads.

In the embodiment of FIG. 11, each edge has two separate input reference voltage lines (VREF1 and VREF2, VREF3 and VREF4, VREF5 and VREF6, VREF7 and VREF8) and two separate output voltage lines (VCCO1 and VCCO2, VCCO3 and VCCO4, VCCO5, and VCCO6, VCCO7 and VCCO8, respectively). Therefore, the FPGA of FIG. 11 can interface with other ICs conforming to up to eight different I/O standards. The number of separate input reference voltages and output voltage supplies can be two, four, sixteen, or any other number. This aspect of the invention can further be applied to ICs other than FPGAs.

Advantages of the Invention

A configurable input/output buffer according to a first aspect of the present invention offers the advantages of compatibility with two or more different I/O standards. In one embodiment, each I/O can be separately configured. In another embodiment, several I/O are configured as a group. Therefore, a single FPGA can interface with two or more different ICs at the same time that follow two or more different I/O standards. Since the I/O standard followed by each input/output buffer can be changed by simply reconfiguring the FPGA, the resulting FPGA has a flexible input/output interface that can also adapt with the semiconductor industry to changes in I/O standards and operating voltage levels.

A configurable connection of an I/O pad to one or more input reference lines allows the I/O pad to supply the input reference voltage, in accordance with a second aspect of the present invention. This aspect of the invention offers the advantages of a flexible pinout assignment in an FPGA. According to this aspect of the invention, the input reference voltage can be applied at any configurable I/O pad.

A reference input that is configurably connected to any of two or more input reference voltage lines in accordance with a third aspect of the invention makes it possible to supply each of several input reference voltages to every input/output buffer in the FPGA.

The separation of input reference voltages and/or output voltage supplies in accordance with fourth and fifth aspects of the invention allows an FPGA to interface relatively easily with a plurality of ICs that operate at different voltage levels.

Thus it will be understood that the present invention provides an input/output interface with many novel aspects in an FPGA or a portion thereof.

Those having skill in the relevant arts of the invention will now perceive various modifications and additions which may be made as a result of the disclosure herein of preferred embodiments. Accordingly, all such modifications and additions are deemed to be within the scope of the invention, which is to be limited only by the appended claims and their equivalents.

What is claimed is:

1. An Input/Output Block (IOB), comprising:
    a pad connected to a pad line;
    an output buffer driving said pad line, said output buffer comprising a pullup for pulling said pad line to a high voltage level; and
    means for configurably supplying any one of two or more output supply voltages to said pullup, comprising:
        two or more P-channel transistors each connected in series with said pullup;
        means for connecting each such P-channel transistor to a different output supply voltage; and
        means for configurably enabling or disabling each such P-channel transistor.

2. The IOB of claim 1, wherein said pullup is disposed between said pad line and said two or more P-channel transistors.

3. The IOB of claim 1, wherein said means for configurably enabling or disabling each such P-channel transistor comprises a configuration memory cell.

4. An Input/Output Block (IOB) comprising:
    a pad connected to a pad line;
    an output buffer driving said pad line, said output buffer comprising a pullup for pulling said pad line to a high voltage level;
    two or more output voltage lines supplying two or more output supply voltages; and
    means for configurably coupling any one of said two or more output voltage lines to said pullup, comprising:
        two or more transistors each connected in series with said pullup;
        means for connecting each such transistor to a different one of said two or more output voltage lines; and
        means for configurably enabling or disabling each such transistor.

5. The IOB of claim 4, wherein said pullup is disposed between said pad line and said two or more transistors.

6. The IOB of claim 4, wherein said two or more transistors comprise P-channel transistors.

7. The IOB of claim 4, wherein said means for configurably enabling or disabling each such transistor comprises a configuration memory cell.

8. An Input/Output Block (IOB), comprising:
    a pad connected to a pad line;
    an output buffer driving said pad line, said output buffer comprising a pullup for pulling said pad line to a high voltage level; and
    means for configurably supplying any one of two or more output supply voltages to said pullup, comprising:
        two or more transistors each connected in series with said pullup;
        two or more output voltage lines supplying said two or more output supply voltages;
        means for connecting each such transistor to a different one of said output voltage lines; and
        means for configurably enabling or disabling each such transistor.

9. The IOB of claim 8, wherein said pullup is disposed between said pad line and said two or more transistors.

10. The IOB of claim 8, wherein said two or more transistors comprise P-channel transistors.

11. The IOB of claim 8, wherein said means for configurably enabling or disabling each such transistor comprises a configuration memory cell.

12. A configurable pullup structure, comprising:
    an output terminal;
    a pullup for supplying a high voltage level to the output terminal;
    two or more transistors each connected in series with the pullup;
    means for coupling each of the two or more transistors to a different output supply voltage; and
    means for configurably enabling or disabling each of the two or more transistors.

13. The configurable pullup structure of claim 12, wherein the pullup is disposed between the output terminal and the two or more transistors.

14. The configurable pullup structure of claim 12, wherein the two or more transistors comprise P-channel transistors.

15. The configurable pullup structure of claim 10, wherein the means for configurably enabling or disabling each such transistor comprises a configuration memory cell.

* * * * *